United States Patent
Tanaka et al.

(10) Patent No.: US 7,619,255 B2
(45) Date of Patent: Nov. 17, 2009

(54) LAYER-STACKED WIRING AND METHOD FOR MANUFACTURING SAME AND SEMICONDUCTOR DEVICE USING SAME AND METHOD FOR MANUFACTURING SEMICONDUCTOR DEVICE

(75) Inventors: Jun Tanaka, Tokyo (JP); Hiroshi Kanoh, Tokyo (JP)

(73) Assignees: NEC Corporation, Tokyo (JP); NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 11/723,600

(22) Filed: Mar. 21, 2007

(65) Prior Publication Data

US 2007/0221922 A1     Sep. 27, 2007

(30) Foreign Application Priority Data

Mar. 22, 2006   (JP)   .............................. 2006-078653

(51) Int. Cl.
   *H01L 29/15* (2006.01)
(52) U.S. Cl. .............................. 257/72; 257/59; 257/66; 257/57; 257/E29.292; 438/150; 438/592
(58) Field of Classification Search ................... 257/57, 257/E29.292, 59, 66, 72; 438/150, 592
   See application file for complete search history.

(56) References Cited

U.S. PATENT DOCUMENTS 4,800,177 A * 1/1989 Nakamae .................... 438/627
6,545,407 B1 * 4/2003 Raina .......................... 313/497
2004/0195575 A1 * 10/2004 Komoda et al. ............... 257/77
2006/0228897 A1 * 10/2006 Timans ....................... 438/758

FOREIGN PATENT DOCUMENTS

| JP | 3282582     | 3/2002 |
| JP | 2004-281506 | 10/2004 |
| JP | 2004-336073 | 11/2004 |
| JP | 3613221     | 11/2004 |

* cited by examiner

*Primary Examiner*—Tu-Tu V Ho
(74) *Attorney, Agent, or Firm*—Young & Thompson

(57) ABSTRACT

A layer-stacked wiring made up of a microcrystalline silicon thin film and a metal thin film is provided which is capable of suppressing an excessive silicide formation reaction between the microcrystalline silicon thin film and metal thin film, thereby preventing peeling of the thin film. In a polycrystalline silicon TFT (Thin Film Transistor) using the layer-stacked wiring, the microcrystalline silicon thin film is so configured that its crystal grains each having a length of the microcrystalline silicon thin film in a direction of a film thickness being 60% or more of a film thickness of the microcrystalline silicon thin film amount to 15% or less of total number of crystal grains or that its crystal grains each having a length of the microcrystalline silicon thin film in a direction of a film thickness being 50% or less of a film thickness of the microcrystalline silicon thin film amount to 85% or more of the total number of crystal grains making up the microcrystalline silicon thin film.

3 Claims, 8 Drawing Sheets

- 11: Interlayer Insulating Film
- 9: Metal Thin Film (Chromium Thin Film)
- 8: Microcrystalline Silicon Thin Film
- 7: Gate Insulating Film

- 11: Interlayer Insulating Film
- 9: Metal Thin Film (Chromium Thin Film)
- 8: Microcrystalline Silicon Thin Film
- 7: Gate Insulating Film Length L of Crystal Grain in Film Thickness Direction

FIG.10

| No. | Relation Between Deposition Condition for Microcrystalline Silicon Thin Film and Its Film Thickness. | Activated Time [hour] | Hydrogenated Time [min] | Peeling-off of Film | Occurrence Rate [%] |
|---|---|---|---|---|---|
| 1 | 100nm Under Deposition Condition of Being 13nm/min. | 4 | 30 | ○ | 0 |
| 2 | 100nm Under Deposition Condition of Being 24nm/min. | 4 | 30 | × | 25 |
| 3 | 20nm Under Deposition Condition of Being 13nm/min. →80nm Under Deposition Condition of Being 24nm/min. | 4 | 30 | ○ | 0 |
| 4 | 80nm Under Deposition Condition of Being 24nm/min. →20nm Under Deposition Condition of Being 13nm/min. | 4 | 30 | ○ | 0 |
| 5 | 100nm Under Deposition Condition of Being 24nm/min. | 1 | 30 | ○ | 0 |
| 6 | 100nm Under Deposition Condition of Being 24nm/min. | 4 | 5 | ○ | 0 |
| 7 | 100nm Under Deposition Condition of Being 24nm/min. | 1 | 5 | ○ | 0 |

# LAYER-STACKED WIRING AND METHOD FOR MANUFACTURING SAME AND SEMICONDUCTOR DEVICE USING SAME AND METHOD FOR MANUFACTURING SEMICONDUCTOR DEVICE

BACKGROUND OF THE INVENTION

1. Field of the Invention

The present invention relates to a layer-stacked wiring, a method of manufacturing the layer-stacked wiring, a semiconductor using the layer-stacked wiring, and a method of manufacturing the semiconductor using the layer-stacked wiring and more particularly to the layer-stacked wiring, which employs a microcrystalline silicon thin film, to be applied to a gate electrode of a TFT (Thin Film Transistor) or a like, and the method of manufacturing the layer-stacked wiring and to the semiconductor device using the layer-stacked wiring and the method for manufacturing the semiconductor device.

The present application claims priority of Japanese Patent Application No. 2006-078653 filed on Mar. 22, 2006, which is hereby incorporated by reference.

2. Description of the Related Art

For example, in a conventional LCD (Liquid Crystal Display) device known as a representative display device, use of an amorphous silicon thin film which employs an amorphous silicon thin film as its active layer is in the mainstream. However, low mobility of the amorphous silicon thin film causes the LCD device to be unable to be high-definition and, therefore, attention is focused on a polycrystalline silicon TFT which uses a polycrystalline silicon thin film having high mobility as its active layer.

On the other hand, due to diversification of use of the LCD devices, there is a strong need for making the LCD device thin and small in size and, responsive to these needs, efforts have been made so that a driving circuit made up of a TFT is formed on an active-matrix substrate. However, the formation of the TFT to be employed as the TFT for a driving circuit using an amorphous silicon thin film is not desirable in terms of an operation rate and driving capability and it is, therefore, necessary that the TFT for a driving circuit is formed by using a polycrystalline thin film having higher mobility. As a method for forming a polycrystalline thin film, from a view point of a lowered process temperature, improvement of a throughput, and low costs, the use of a laser annealling method in which a polycrystalline thin film can be formed on a low-priced low-temperature glass substrate now becomes mainstream.

However, the polycrystalline TFT has a problem in that it is less reliable when used as a gate electrode and in that it is not easy to obtain a gate electrode of low resistance, thus causing it difficult to realize the LCD with high-definition using the polycrystalline TFT. To solve this problem, polycrystalline silicon TFTs are disclosed in, for example, Patent References 1 (Japanese Patent No. 3282528), 2 (Japanese Patent No. 3613221), 3 (Japanese Patent Application Laid-open No. 2004-336073), and 4 (Japanese Patent Application Laid-open No. 2004-281506) in which a gate electrode is constructed by using a layer-stacked wiring made up of a microcrystalline silicon thin film (lower layer) and a metal thin film (upper layer).

FIG. 11 is a cross-sectional view showing a conventional polycrystalline silicon TFT in which the layer-stacked wiring using the above microcrystalline thin film disclosed in, for example, the above Patent Reference 1 is employed as its gate electrode. The polycrystalline silicon TFT 100, as shown in FIG. 11, includes an insulating substrate 101, a front-end insulating film 102 formed on the insulating substrate 101, a polycrystalline silicon thin film 103 formed on the front-end insulating film 102, a source region 104 formed on one end of the polycrystalline silicon thin film 103 and a drain region 105 formed on the other end of the polycrystalline silicon thin film 103, a gate insulating film 106 formed on the polycrystalline silicon thin film 103, a gate electrode having a microcrystalline silicon thin film (lower layer) 107 formed on the gate insulating film 106 and a metal thin film (upper layer) 108 formed on the microcrystalline silicon thin film 107. Moreover, the polycrystalline silicon TFT 100 also includes an interlayer insulating film 110 formed on all entire surfaces of the gate insulating film 106 including the surface of the gate electrode 109, a source electrode 113 being in contact with the source region 104 via a contact hole 111 obtained by forming a hole through the interlayer insulating film 110, and a drain electrode 114 being in contact with the drain region 105 via a contact hole 112 obtained by forming a hole through the interlayer insulating film 110.

Here, the microcrystalline silicon thin film 107 making up the gate electrode 109 is a silicon thin film deposited by a plasma CVD (Chemical Vapor Deposition), in a crystal structure of which extremely fine crystal grains and amorphous grains exist in a mixed manner. The deposition temperature of the microcrystalline silicon thin film is about 300° C. which is considerably lower when compared with the temperature of 600° C. applied in a low-pressure CVD method or an atmospheric pressure CVD method generally used as a deposition method of the conventional polycrystalline thin film and, therefore, this method is excellent in terms of a throughput of a deposition process and manufacturing costs, providing an advantage of being a highly productive method. The microcrystalline silicon thin film 107 also serves to prevent an excess release of hydrogen from the gate electrode 109 and the polycrystalline silicon thin film making up an active later.

Moreover, the resistance of the microcrystalline thin film, due to its existence of the fine crystal grains, can be made lower to the same degree as in the polycrystalline silicon thin film. Therefore, by applying the layer-stacked wiring formed by stacking a metal thin film on the microcrystalline silicon thin film, reliability of the gate electrode is improved and low-resistance of the gate electrode is realized, which makes it easy to achieve an LCD device with high definition.

However, the conventional layer-stacked wiring made up of the microcrystalline silicon thin film and metal thin film has a problem in that the occurrence of a silicide formation reaction between the microcrystalline silicon thin film serving as the lower layer and the metal thin film serving as the upper layer causes peeling of the microcrystalline silicon thin film. That is, when the layer-stacked wiring as described above is to be applied to a gate electrode of the polycrystalline silicon TFT, in the process of manufacturing the polycrystalline silicon TFT, an annealing process (activating process) to activate an impurity such as phosphorus, boron, or a like implanted in advance into the polycrystalline thin film and a hydrogenating process to terminate an orbit being in an unbonded state (dangling bond) existing in the polycrystalline thin film and at an interface between the polycrystalline thin film and gate insulating film by using hydrogen are required. In each of the annealing process and hydrogenating process, heat treatment to be performed at a temperature being higher than a deposition temperature for the microcrystalline silicon thin film and metal thin film is necessary and, as a result, the occurrence of the above-described silicide formation reaction affected by the high-temperature heat treatment is unavoidable between the microcrystalline silicon thin film and metal thin film, both being already formed.

If the silicide formation reaction occurs excessively between the microcrystalline silicon thin film serving as the lower layer and the metal thin film serving as the upper layer, a crystal making up a crystal structure of the microcrystalline silicon thin film is changed from its powder-like shape to its cylinder-like shape. During this change in its crystalline shape, a change in volume of the microcrystalline silicon thin film occurs, which causes the occurrence of voids in the microcrystalline silicon thin film or at an interface between the microcrystal thin film serving as the lower layer and metal thin film serving as the upper layer, which further causes the occurrence of peeling of the microcrystalline silicon thin film affected by the voids at a final stage.

Thus, the formation of the microcrystalline silicon thin film by employing the plasma CVD method provides an advantage of being the more highly productive when compared with the formation of the polycrystalline thin film by using the low-pressure CVD method or atmospheric pressure CVD method. On the other hand, in order to respond to a need for further improvement of productivity, the formation of the microcrystalline silicon thin film under a condition of a higher deposition rate using the plasma CVD method is required. However, in general, there is a tendency that quality of a thin film formed under a condition of a higher deposition rate degrades easily. Therefore, the degradation of the quality of the microcrystalline silicon thin film causes the acceleration of the silicide formation reaction between the microcrystalline silicon thin film and metal thin film to be formed on the microcrystalline silicon thin film serving as its upper layer, which leads to easy peeling of the microcrystalline silicon thin film and, as a result, further to peeling of the layer-stacked wiring.

SUMMARY OF THE INVENTION

In view of the above, it is an object of the present invention to provide a method of manufacturing a layer-stacked wiring which is capable of suppressing excessive occurrence of a silicide formation reaction between a microcrystalline silicon thin film and a metal thin film to prevent peeling of the microcrystalline silicon thin film and a semiconductor device using the layer-stacked wiring and a method of manufacturing the semiconductor device.

According to a first aspect of the present invention, there is provided a layer-stacked wiring including:

a microcrystalline silicon thin film; and a metal thin film formed on the microcrystalline silicon thin film, wherein crystal grains making up a crystal structure of the microcrystalline silicon thin film, each having a length of the microcrystalline silicon thin film in a direction of a film thickness being 60% or more of a film thickness of the microcrystalline silicon thin film amount to 15% or less of total number of the crystal grains.

According to a second aspect of the present invention, there is provided a layer-stacked wiring including:

a microcrystalline silicon thin film; and a metal thin film formed on the microcrystalline silicon thin film, wherein crystal grains making up a crystal structure of the microcrystalline silicon thin film, each having a length of the microcrystalline silicon thin film in a direction of a film thickness being 50% or less of a film thickness of the microcrystalline silicon thin film amount to 85% or more of the total number of crystal grains.

According to a third aspect of the present invention, there is provided a method for manufacturing a layer-stacked wiring including a microcrystalline silicon thin film and a metal thin film formed on the microcrystalline silicon thin film, the method including:

a microcrystalline silicon thin film forming process to form a portion corresponding to a desired film thickness of the microcrystalline silicon thin film on an insulating substrate at a deposition rate that does not degrade, at least, quality of a thin film of the microcrystalline silicon thin film;

a metal thin film forming process to form the metal thin film on the microcrystalline silicon thin film; and a heat treatment process to perform heat treatment on the insulating substrate formed on the microcrystalline silicon thin film and the metal thin film.

In the foregoing, a preferable mode is one wherein, in the microcrystalline silicon thin film forming process, a portion corresponding to a desired film thickness of the microcrystalline silicon thin film at a deposition rate combined with a deposition rate that degrades quality of a thin film of the microcrystalline silicon thin film.

Also, a preferable mode is one wherein, in the microcrystalline silicon thin film forming process, a portion corresponding to at least 20% of a film thickness of the microcrystalline silicon thin film is formed at a deposition rate that does not degrade quality of the thin film.

Also, a preferable mode is one wherein the deposition rate that does not degrade quality of the thin film is 13 nm/min.

Also, a preferable mode is one wherein the heat treatment process includes an activating process to perform heat treatment on an impurity implanted in advance and a hydrogenating process to perform heat treatment in an atmosphere of nitrogen.

Also, a preferable mode is one wherein the activating process is performed at 400° C. or more and for four hours or less.

Also, a preferable mode is one wherein the hydrogenating process is performed at 350° C. or more and for 30 minutes or less.

According to a fourth aspect of the present invention, there is provided a semiconductor device including:

a polycrystalline silicon thin film having a source region and a drain region at its both ends, which is formed on an insulating substrate with a front-end insulating film interposed between the polycrystalline silicon thin film and the insulating substrate; and a gate electrode formed on the polycrystalline silicon thin film with a gate insulating film interposed between the gate electrode and the polycrystalline silicon thin film, wherein the gate electrode includes a layer-stacked wiring including:

a microcrystalline silicon thin film; and a metal thin film formed on the microcrystalline silicon thin film, wherein crystal grains making up a crystal structure of the microcrystalline silicon thin film, each having a length of the microcrystalline silicon thin film in a direction of a film thickness being 60% or more of a film thickness of the microcrystalline silicon thin film amount to 15% or less of total number of the crystal grains.

According to a fifth aspect of the present invention, there is provided a semiconductor device including:

a polycrystalline silicon thin film having a source region and a drain region at its both ends, which is formed on an insulating substrate with a front-end insulating film interposed between the polycrystalline silicon thin film and the insulating substrate; and a gate electrode formed on the polycrystalline silicon thin film with a gate insulating film interposed between the gate electrode and the polycrystalline silicon thin film, wherein the gate electrode includes a layer-stacked wiring including:

a microcrystalline silicon thin film; and a metal thin film formed on the microcrystalline silicon thin film, wherein crystal grains making up a crystal structure of the microcrystalline silicon thin film, each having a length of the microcrystalline silicon thin film in a direction of a film thickness being 50% or less of a film thickness of the microcrystalline silicon thin film amount to 85% or more of the total number of crystal grains.

According to a sixth aspect of the present invention, there is provided a method for manufacturing a semiconductor device including:

a process of forming an amorphous silicon thin film on an insulating substrate with a front-end insulating film interposed between the amorphous silicon thin film and the insulating substrate;

a process of crystallizing the amorphous silicon thin film to form a polycrystalline silicon thin film by performing a laser annealing process on the amorphous silicon thin film;

a process of forming, after making the polycrystalline silicon thin film have an island structure, a layer-stacked film including a microcrystalline silicon thin film and a metal thin film which are stacked sequentially on a gate insulating film; and a process of performing patterning on the layer-stacked film to form a gate electrode having a desired shape;

wherein, as the microcrystalline silicon thin film, a thin film is used whose crystal grains, each having a length of the microcrystalline silicon thin film in a direction of a film thickness being 60% or more of a film thickness of the thin film amount to 15% or less of total number of crystal grains making up the thin film or whose crystal grains, each having a length of the thin film in a direction of a film thickness being 50% or less of a film thickness of the thin film amount to 85% or more of the total number of crystal grains making up the thin film.

With the above configuration, the microcrystalline silicon thin film constituting the layer-stacked wiring is so configured that its crystal grains, which makes up a crystal structure of the microcrystalline silicon thin film, each having a length of the microcrystalline silicon thin film in a direction of a film thickness being 60% or more of a film thickness of the microcrystalline silicon thin film amount to 15% or less of total number of crystal grains or that its crystal grains each having a length of the microcrystalline silicon thin film in a direction of a film thickness being 50% or less of a film thickness of the microcrystalline silicon thin film amount to 85% of the total number of crystal grains. Therefore, an excessive silicide formation reaction between the microcrystalline silicon thin film and metal thin film can be suppressed, as a result, preventing peeling of the thin film.

With the above configuration, the microcrystalline silicon thin film is formed under a deposition condition that does not degrade the film quality, the silicide formation reaction between the microcrystalline silicon thin film and metal thin film can be suppressed and, therefore, the peeling of the thin film does not occur.

With the above configuration, the gate electrode is made up of the layer-stacked wiring consisting of the microcrystalline silicon thin film having crystalline components described above, it is made possible to provide the gate electrode having higher reliability and decreased resistance. By combining known processes of manufacturing the semiconductor device, the semiconductor device having the gate electrode described above can be manufactured at lower costs.

BRIEF DESCRIPTION OF THE DRAWINGS

The above and other objects, advantages, and features of the present invention will be more apparent from the following description taken in conjunction with the accompanying drawings in which:

FIG. 10 is also a diagram explaining principles of the present invention and shows a relation of correspondence between a deposition condition for a microcrystalline silicon thin film and peeling of the thin film.

DETAILED DESCRIPTION OF THE PREFERRED EMBODIMENTS

Figure 1:
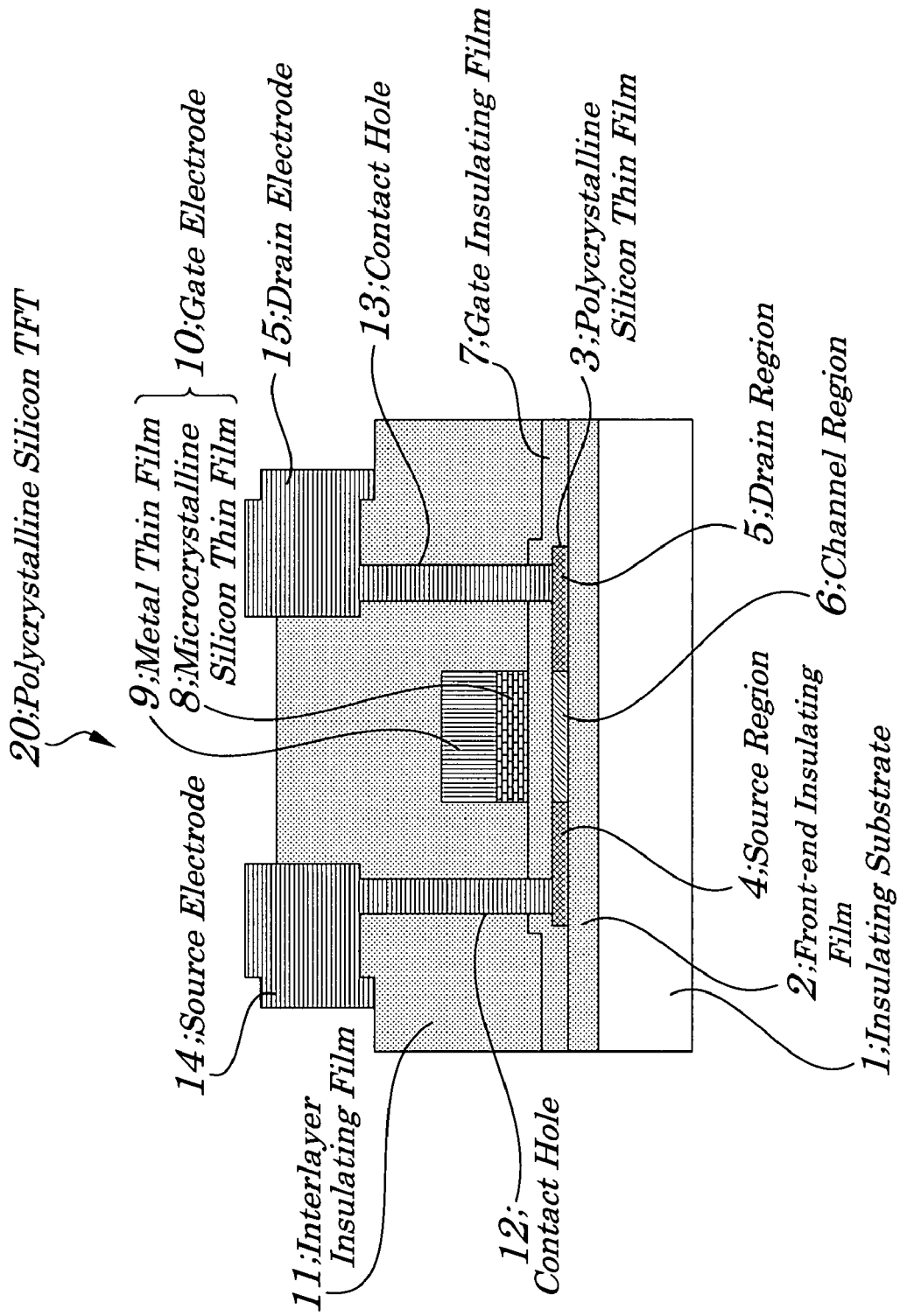
FIG. 1 is a cross-sectional view of a semiconductor device using a layer-stacked wiring according to a first embodiment of the present invention.

Best modes of carrying out the present invention will be described in further detail using various embodiments with reference to the accompanying drawings. When the microcrystalline silicon thin film 8 shown in FIG. 1 is deposited, its lower portion corresponding to 20 nm in film thickness, out of, for example, 100 nm in film thickness is formed under a condition of a deposition rate being 13 nm/min and its upper portion corresponding to remaining 80 nm in film thickness is formed under a condition of the deposition rate being 24 nm/min. Then, an activating process is performed on the microcrystalline silicon thin film 8 at 450° C. for four hours in an atmosphere of nitrogen and a hydrogenating process is performed at 400° C. for 30 minutes.

Principles of the Invention

Figure 5:
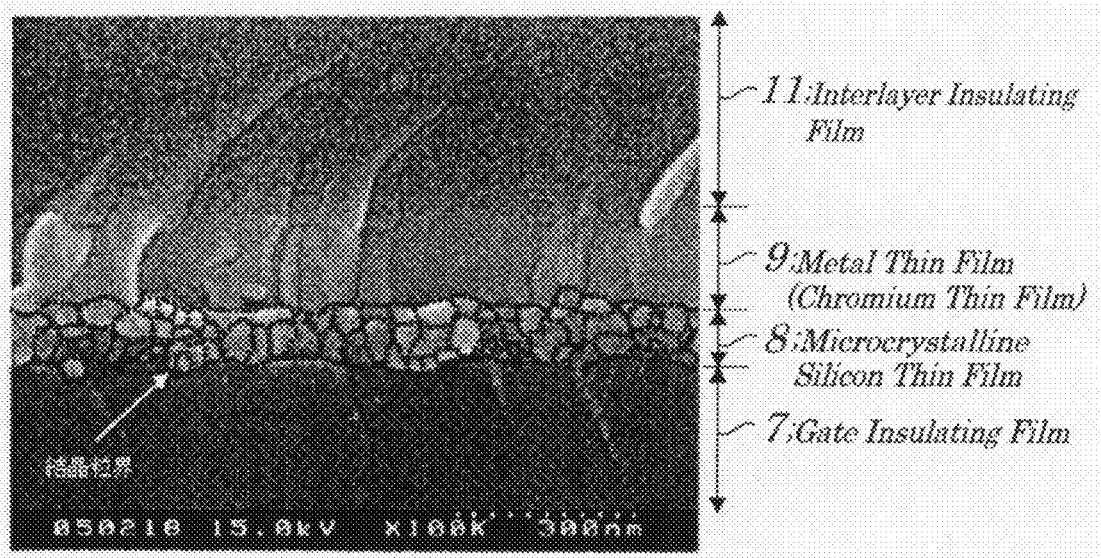
FIG. 5 is a diagram explaining principles of the present invention and is a photo of a cross section of a crystal structure of a microcrystalline silicon thin film in which no peeling of the thin film occurred even after heat treatment process.
Figure 6:
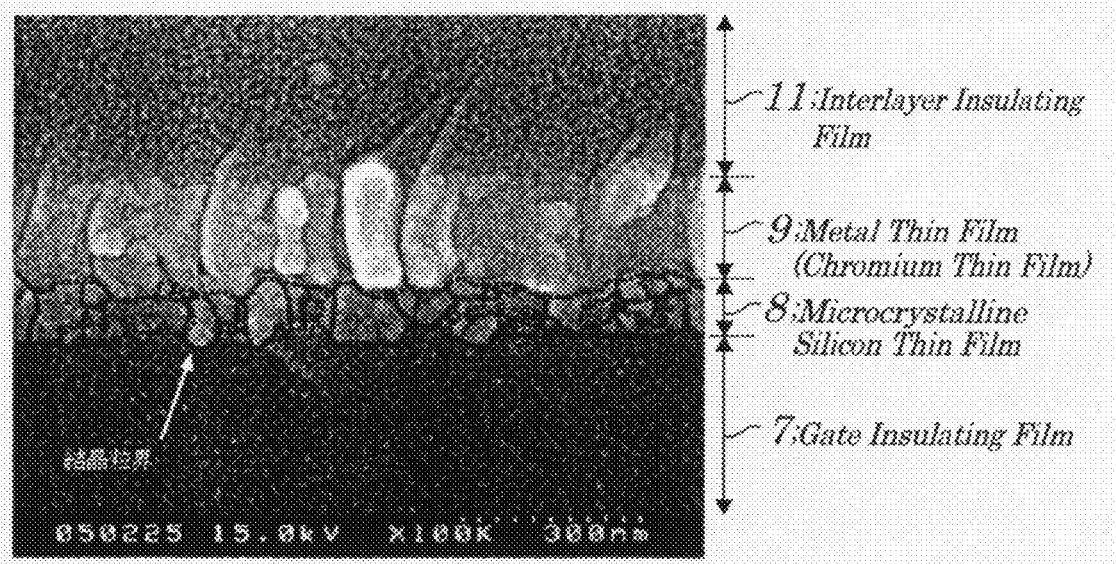
FIG. 6 is also a diagram explaining principles of the present invention and is another photo of a cross section of a crystal structure of a microcrystalline silicon thin film in which peeling of the thin film occurred after heat treatment process.

As a result of earnest researches by the inventors of the present invention, it was found that there is a difference in size of each crystal grain making up a crystal structure of the microcrystalline silicon thin film between the microcrystalline silicon thin film in which peeling of the thin film occurred after heat treatment processes such as an activating process, hydrogenating process, or a like and the microcrystalline silicon thin film in which no peeling of the thin film occurred even after the heat treatment processes. FIG. 5 is a photo of a cross section of a crystal structure of the microcrystalline silicon thin film in which no peeling of the thin film occurred even after heat treatment process. FIG. 6 is another photo of a cross section of a crystal structure of a microcrystalline silicon thin film in which peeling of the thin film occurred after the heat treatment processes. As is apparent from the comparison of the two photos, many relatively-small crystal grains are contained in the structure of the microcrystalline silicon thin film in which no peeling of the thin film occurred as shown in FIG. 5, while many relatively-large crystal grains which have grown in their film thickness direction are contained in the structure of the microcrystalline silicon thin film in which the peeling of the thin film occurred as shown in FIG. 6. In the microcrystalline silicon thin film in which the peeling of the thin film occurred, the silicide formation reaction occurred between the microcrystalline silicon thin film and the metal thin film serving as an upper layer and there were many crystal grains which have grown in their film thickness direction.

Figure 7:
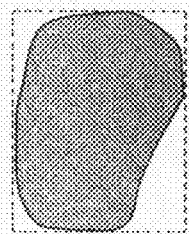
FIG. 7 is a diagram explaining a definition of a length of a crystal grain making up a crystal structure of the microcrystalline silicon thin film.
Figure 8:
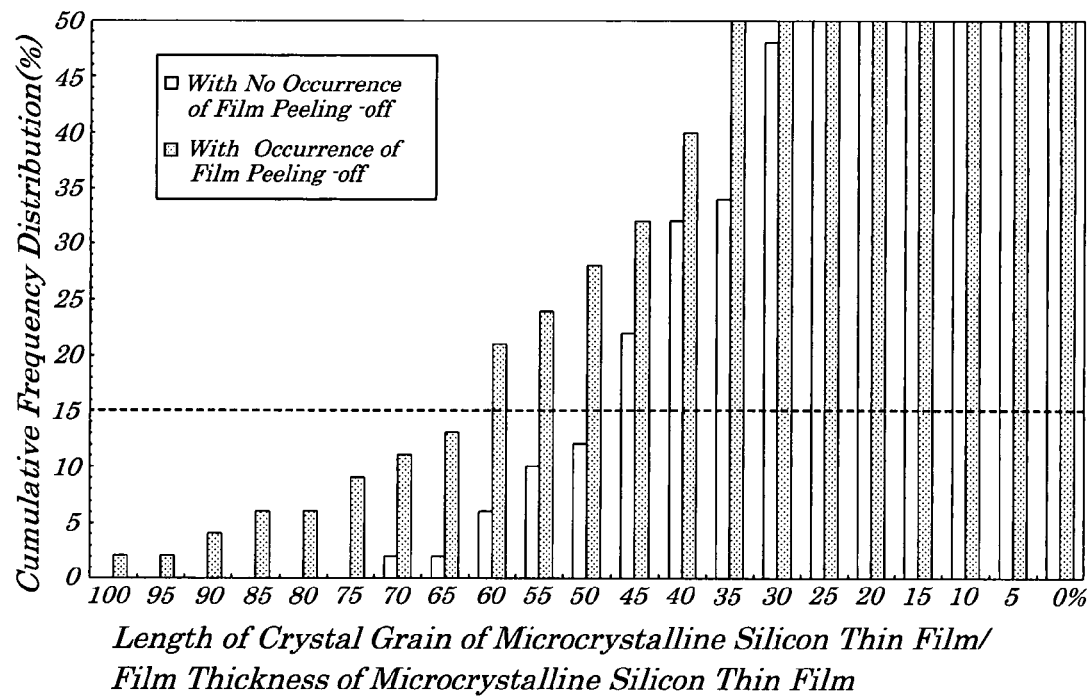
FIG. 8 is a diagram explaining principles of the present invention and is a cumulative frequency distribution table showing a relation between cumulative frequency distribution (ordinate) and length of a crystal grain of a microcrystalline silicon thin film/thickness of the microcrystalline silicon thin film (abscissa)
Figure 9:
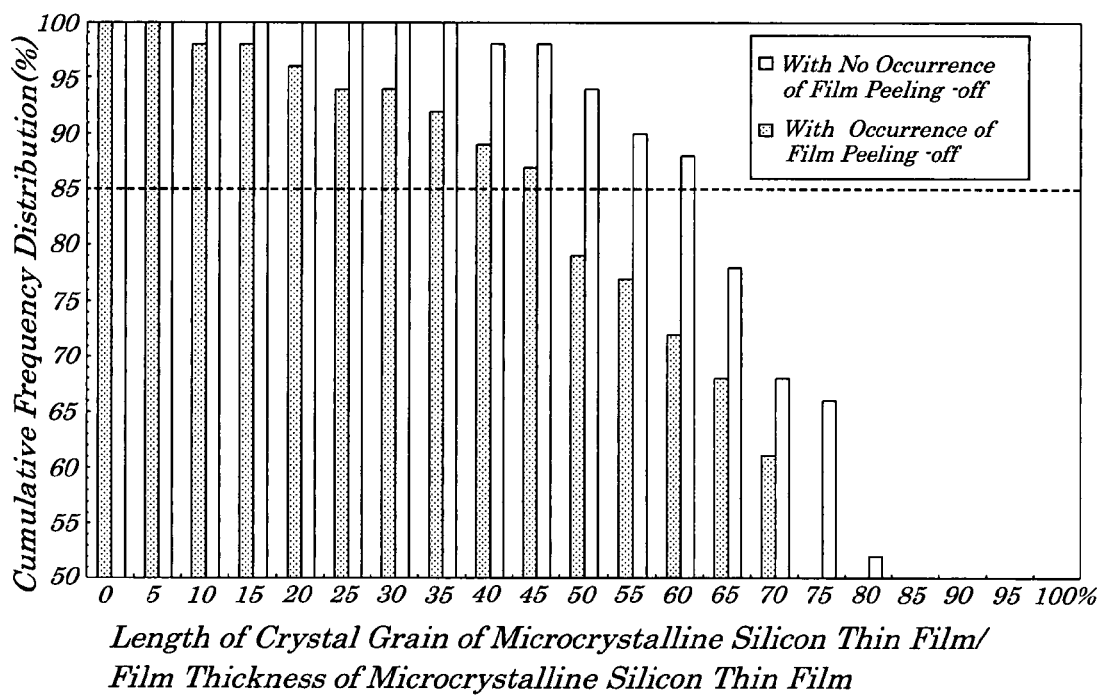
FIG. 9 is also a diagram explaining principles of the present invention and is a cumulative frequency distribution table showing a relation between cumulative frequency distribution (ordinate) and length of a crystal grain of a microcrystalline silicon thin film/thickness of the microcrystalline silicon thin film (abscissa)
Figure 11:
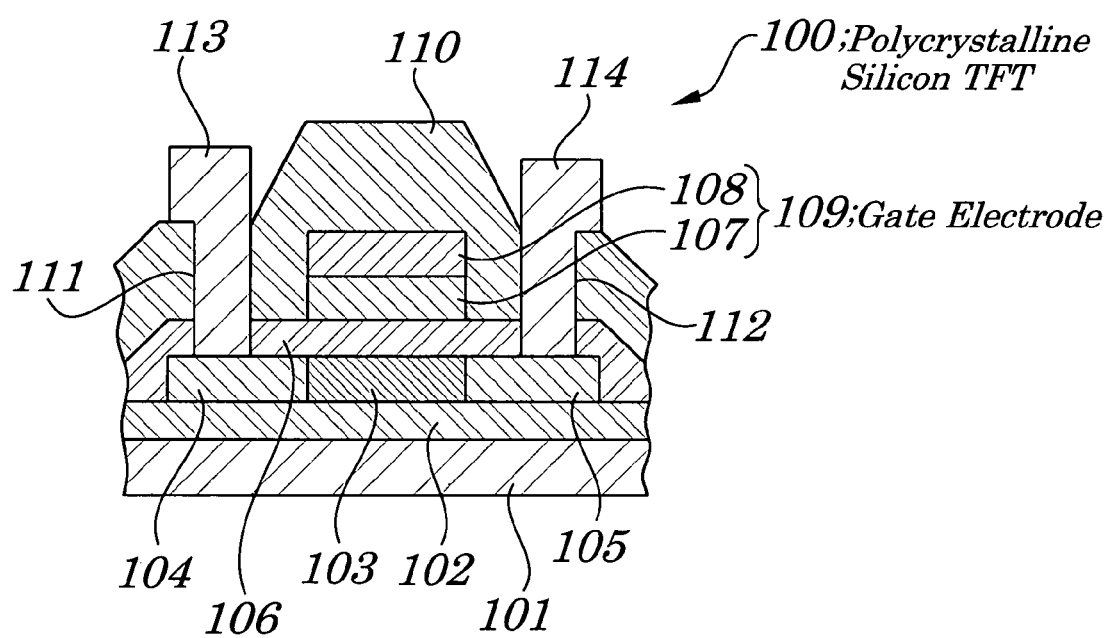
FIG. 11 is a cross-sectional view showing a semiconductor device using the conventional layer-stacked wiring.

Therefore, in order to track how the size of the crystal grain making up the crystal structure of the microcrystalline silicon thin film exerts influences on the peeling of the thin film, the size of the crystal grain was determined using the photos shown in FIGS. 5 and 6. For the determination of the size, as shown in FIG. 7, a rectangle was circumscribed around portions surrounding the crystal grain and a longitudinal length L of the rectangle was obtained which was defined as a length of the crystal grain in a direction of a film thickness. Next, a length L of each crystal grain is normalized based on a film thickness and a cumulative frequency distribution table as shown in FIGS. 8 and 9 was created. In FIGS. 8 and 9, a cumulative frequency distribution (%) is plotted as ordinate and length of crystal grain of microcrystalline silicon thin film/thickness of microcrystalline silicon thin film as abscissa. Moreover, one of two □ marks shows no occurrence of peeling of a thin film and the other of the □ marks shows occurrence of peeling of the thin film.

FIG. 8 shows that, in the case of no occurrence of peeling of the microcrystalline silicon thin film, the microcrystalline silicon thin film is formed so that its crystal grains each having a length of the microcrystalline silicon thin film in a direction of a film thickness being 60% or more of a film thickness of the microcrystalline silicon thin film amount to 15% or less of total number of crystal grains making up the microcrystalline silicon thin film. On the contrary, in the case of occurrence of peeling of the microcrystalline silicon thin film, the microcrystalline silicon thin film is formed so that its crystal grains each having a length of the microcrystalline silicon thin film in a direction of a film thickness being 50% or less of a film thickness of the microcrystalline silicon thin film amount to 85% or more of the total number of crystal grains. Therefore, by forming the microcrystalline silicon thin film so that conditions provided in FIGS. 8 and 9 can be satisfied, the occurrence of the peeling of the thin film can be prevented.

Moreover, the inventors of the present invention have found conditions for deposition under which the occurrence of peeling of a thin film can be prevented when a microcrystalline silicon thin film is formed and have obtained results shown in FIG. 10. FIG. 10 is a diagram explaining a relation of correspondence between the deposition condition and the peeling of a thin film in which the microcrystalline silicon thin film having, for example, a film thickness of 100 nm as a precondition is formed. In FIG. 10, the item No. 1 shows a case where a portion corresponding to 100 nm in film thickness of the microcrystalline silicon thin film is formed under a condition of a deposition rate being 13 nm/min and, even after the activating process for 4 hours and even after the hydrogenating process for 30 minutes, no peeling of the thin film occurred. Also, the item No. 2 shows a case where a portion corresponding to 100 nm in film thickness of the microcrystalline silicon thin film is formed under a condition of a deposition rate being 24 nm/min and, after the activating process for 4 hours and after hydrogenating process for 30 minutes, the peeling of the thin film occurred. The reason for the occurrence of the peeling of the film is that degradation of film quality, which caused acceleration of the silicide formation reaction, occurred due to the increased deposition rate which was applied in order to obtain improved productivity compared with the item No. 1 case. Also, the item No. 3 shows a case where, after the formation of the lower portion corresponding to 20 nm in film thickness under a deposition condition of being 13 nm/min, the upper portion corresponding to 80 nm in film thickness was formed under a deposition condition of being 24 nm/min and, even after the activating processes for 4 hours and hydrogenating processes for 30 minutes, no peeling of the thin film occurred. The reason for no occurrence of the peeling of the thin film is that the silicide formation reaction between the microcrystalline silicon thin film and the metal film was suppressed owing to the formation of the lower portion corresponding to 20 nm in film thickness under the deposition condition that can improve the film quality. The item No. 4, which is contrary to the case of the item No. 3, shows a case where, after the formation of the lower portion corresponding to 80 nm in film thickness under a deposition condition of being 24 nm/min, the upper portion corresponding to 20 nm in film thickness is formed under a deposition condition of being 13 nm/min and, even after activating processes for four hours and hydrogenating processes for 30 minutes, no peeling of the thin film occurred. The reason for no occurrence of the peeling of the thin film is that the silicide formation reaction between the microcrystalline silicon thin film and the metal film was suppressed owing to the formation of the upper portion under the deposition condition that can improve the film quality. That is, as is apparent from the No. 3 and No. 4 cases, it was confirmed that, only if the microcrystalline silicon thin film is formed under a deposition condition that can improve film quality, irrespective of whether a lower portion or upper portion is formed, the silicide formation reaction between the microcrystalline silicon thin film and the metal thin film is suppressed and no peeling of the thin film occurs.

Moreover, the item No. 5 shows a case where, after the formation of a portion corresponding to 100 nm in film thickness under the deposition condition of being 24 nm/min, even if activating process is performed for a short time of one hour, no peeling of the thin film occurred. The reason for no occurrence of peeling of the thin film is that cutting of time for the activating process could decrease an influence by heat treatment. The item No. 6 shows a case where, after the formation of a portion corresponding to 100 nm in film thickness under the deposition condition of being 24 nm/min, even if the hydrogenating process is performed for a short time of 5 minutes, no peeling of the thin film occurred. The reason for no occurrence of peeling of the thin film is that cutting of time for the hydrogenating process could decrease an influence by heat treatment. That is, as is apparent from the No. 5 and No. 6 cases, it was confirmed that, even when the microcrystalline silicon thin film is formed under a deposition condition that can not improve the film quality, only if the time for activating process or for hydrogenating process is shortened, the silicide formation reaction between the microcrystalline silicon thin film and the metal thin film is suppressed and, therefore, no peeling of the thin film occurs.

Moreover, the item No. 7 shows a case where, after the formation of a portion corresponding to 100 nm in film thickness under the deposition condition of being 24 nm/min, even when the activating process is performed for a short time of one hour and the hydrogenating process is performed for a short time of 5 minutes, no peeling of the thin film occurred. The reason for no occurrence of peeling of the thin film is that cutting of time for the activating and hydrogenating processes could decrease influences by heat treatment. Thus, as is apparent from the No. 7 case, it was confirmed that, even when the microcrystalline silicon thin film is formed under a deposition condition that can not improve the film quality, only if the time for activating process and for hydrogenating process is shortened, the silicide formation reaction between the microcrystalline silicon thin film and the metal thin film can be suppressed and, therefore, no peeling of the thin film occurs.

First Embodiment

The first embodiment of the present invention is described based on the principles of the invention described above by referring to accompanied drawings below. FIG. 1 is a cross-sectional view of a semiconductor device using the layer-stacked wiring of the first embodiment of the present invention. Configurations of the semiconductor device are described by referring to FIG. 1. Moreover, in the first embodiment, an example in which a polycrystalline silicon TFT is used as a semiconductor device is explained.

The polycrystalline silicon TFT (semiconductor device) 20 using the layer-stacked wiring, as shown in FIG. 1, includes an insulating substrate 1 made of glass, silica, or a like, a front-end insulating film 2 made of a silicon dioxide film with a thickness of 150 nm formed on the insulating substrate 1, a polycrystalline silicon thin film 3 with a thickness of 50 nm formed on the front-end insulating film 2, a source region 4 formed on one end of the polycrystalline silicon thin film 3, a drain region 5 formed on another end of the polycrystalline silicon thin film 3, a channel region formed between the source region 4 and drain region 5, a gate insulating film 7 made of a silicon dioxide film with a thickness of 100 nm formed on the polycrystalline silicon thin film 3, and a gate electrode made up of a microcrystalline silicon thin film (lower layer) with a thickness of 100 nm formed on the gate insulating film 7 and of a metal thin film (upper layer) 9 made of a chromium thin film with a thickness of 200 formed on the microcrystalline silicon thin film 3.

The microcrystalline silicon thin film 8 making up the lower layer of the gate electrode is formed so that its crystal grains each having a length of the microcrystalline silicon thin film in a direction of a film thickness being 60% or more (about 60 nm or more in the embodiment) of a film thickness of the microcrystalline silicon thin film 3 amount to 15% or less of the total number of crystal grains. Or, the microcrystalline silicon thin film 8 is formed so that its crystal grains each having a length of the microcrystalline silicon thin film in a direction of a film thickness being 50% or less (about 50 nm or less in the embodiment) of a film thickness of the microcrystalline silicon thin film 3 amount to 85% or more of the total number of crystal grains.

Moreover, the polycrystalline silicon TFT 20, as shown in FIG. 1, includes an interlayer insulating film 11 made of a silicon dioxide film with a thickness of 400 nm formed on all entire surfaces of the gate insulating film 11 including the surface of the gate electrode 10, a source electrode 14 made of an aluminum film with a thickness of 500 nm formed so as to be in contact with the source region 4 via a contact hole 12 obtained by forming a hole through the interlayer insulating film 11, and a drain electrode 15 made of the aluminum film with a film thickness of 500 nm formed so as to be in contact with the drain region 5 via a contact hole 13 obtained by forming a hole through the interlayer insulating film 11.

Thus, according to the polycrystalline silicon TFT 20 of the first embodiment, the microcrystalline silicon thin film 8 making up the gate electrode 10 is formed, based on the principles of the invention described above in FIG. 8 or FIG. 9, so that its crystal grains each having a length of the microcrystalline silicon thin film 8 in a direction of a film thickness being 60% or more of a film thickness of the microcrystalline silicon thin film 8 amount to 15% or less of the total number of crystal grains, or so that its crystal grains each having a length of the microcrystalline silicon thin film 8 in a direction of a film thickness being 50% or less of a film thickness of the microcrystalline silicon thin film 8 amount to 85% or more of the total number of crystal grains. Therefore, the excessive silicide formation reaction between the microcrystalline silicon thin film 8 and the metal thin film 9 can be suppressed and, as a result, the peeling of the microcrystalline silicon thin film 8 can be prevented.

Second Embodiment

Figure 2A:
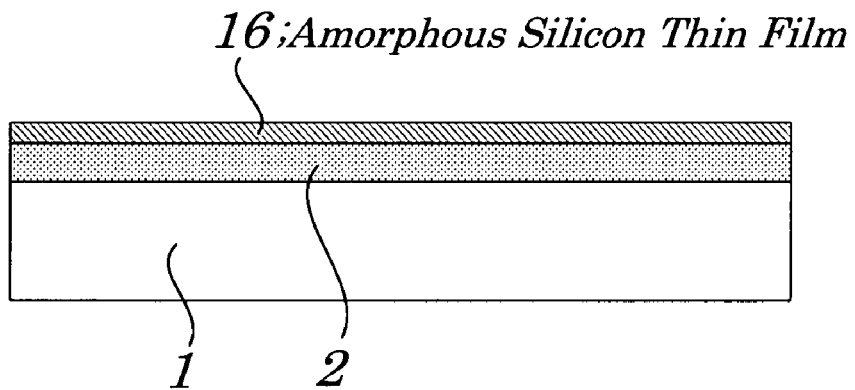
FIGS. 2A, 2B and 2C are process diagrams illustrating, in order of processes, a manufacturing method of a semiconductor device according to a second embodiment of the present invention.

FIGS. 2A to 2C, 3D to 3F, 4G and 4H are process diagrams illustrating, in order of processes, methods for manufacturing a polycrystalline silicon TFT (first manufacturing method) according to the second embodiment of the present invention. First, as shown in FIG. 2A, a silicon dioxide film with a thickness of 150 nm was deposited, by a plasma CVD (Chemical Vapor Deposition) method using $SiH_4$ (monosilane) gas and $N_2O$ (nitrogen oxide) gas as material gas, on a glass substrate (OA-10 glass substrate manufactured by Nippon Electric Glass in Japan) as one example of an insulating substrate 1 to form a front-end insulating film 2. Then, a amorphous silicon thin film 16 with a thickness of 50 nm was deposited, by a plasma CVD method using $SiH_4$ gas as material gas, on the front-end insulating film 2. Next, heat treatment was performed at about 500° C. to release hydrogen from the amorphous silicon thin film 16.

Figure 2B:
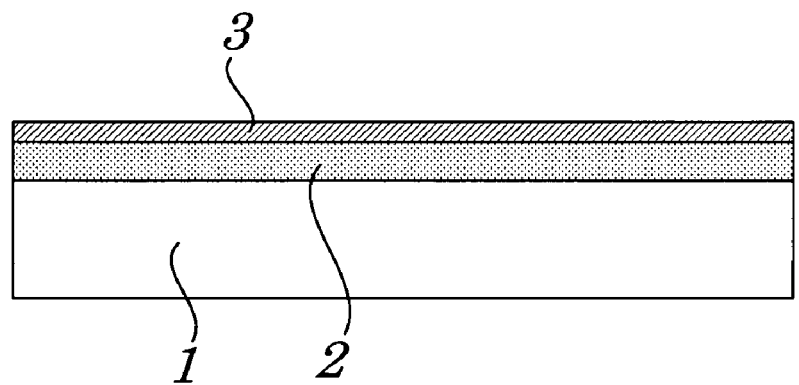
Figure 2C:
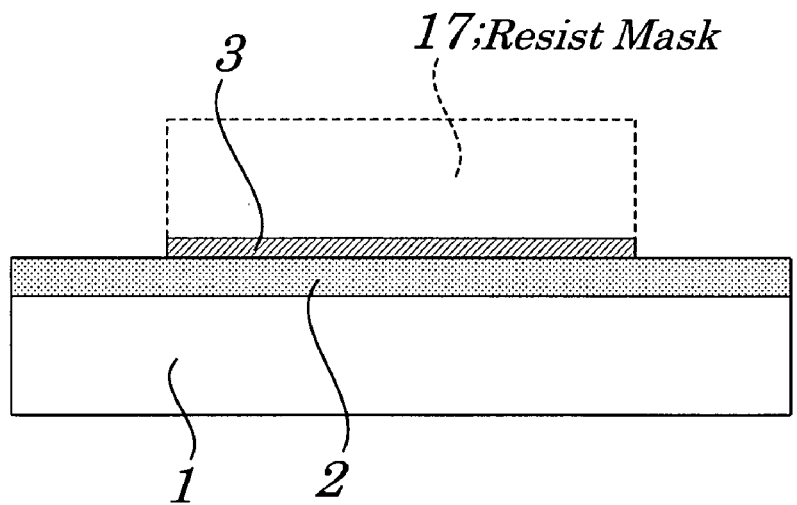

Next, as shown in FIG. 2B, by a laser annealing method, an XeCl (Xenon chloride) excimer laser beam with a waveform of 308 nm was applied to crystallize the amorphous silicon thin film 16 to form a polycrystalline thin film 3 on a front-end insulating film 2. Then, as shown in FIG. 2C, by an ordinal photo-resist method, patterning was performed on a resist coated on an entire surface of the polycrystalline silicon thin film 3 to form a resist mask 17 having a desired shape and, by using this resist mask 17, the polycrystalline silicon thin film 3 was etched by a dry etching method using $Cf_4$ (carbon tetrafluoride) gas and $O_2$ (oxygen) gas as etching gas so as to have an island structure.

Figure 3D:
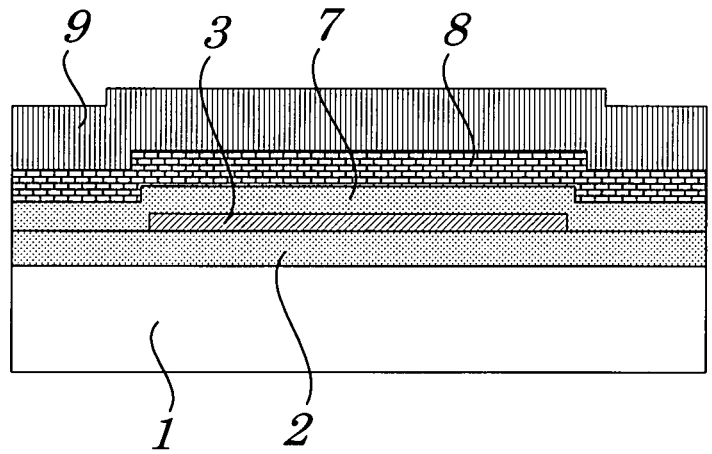
FIGS. 3D, 3E and 3F are also process diagrams illustrating, in order of processes, a manufacturing method of a semiconductor device according to the second embodiment of the present invention.

Next, as shown in FIG. 3D, a silicon dioxide film with a thickness of 100 nm was deposited by a plasma CVD using Si $(OC_2H_5)$ 4 [TEOS (tetraethyl orthosilicate)] and $O_2$ (oxygen) gas as material gas to form a gate insulating film 7 on the polycrystalline silicon thin film 3 having the island structure. Then, a microcrystalline silicon thin film 8 with a thickness of 100 nm was deposited, by a plasma CVD using $SiH_4$ gas, $PH_3$ (phosphorus hydride) gas (diluted with $H_2$ to 5% concentration) and $H_2$ gas as material gas, on the gate insulating film 7. Based on the deposition condition provided as the item N0. 3 in FIG. 10 explaining the principles of the invention described above, a lower portion corresponding to 20 nm in film thickness, out of 100 nm in total in film thickness of the film thickness of the microcrystalline silicon thin film 8 was formed under the deposition condition of being 13 nm/min and its upper portion corresponding to 80 nm in film thickness was formed under the deposition condition of being 24 nm/min. The lower portion corresponding to 20 nm in film thickness was formed by discharging for 95 seconds under deposition conditions of a flow rate of $SiH_4$ gas being 20 sccm (Standard Cubic Centimeter per Minute), flow rate of $H_2$ gas being 2500 sccm, pressure being 260 Pa (Pascal), discharge power density being 1.25 $W/cm^2$, and substrate temperature being 350° C. The upper portion corresponding to 80 nm in film thickness was formed by discharging for 201 seconds under deposition conditions of a flow rate of $SiH_4$ gas being 40 sccm, flow rate of $PH_3$ gas being 65 sccm, flow rate of $H_2$ gas being 2500 sccm, pressure being 260 Pa, discharge power density being 1.25 $W/cm^2$, and substrate temperature being 350° C.

Thus, the lower portion corresponding to 20 nm in film thickness, out of 100 nm in film thickness of the microcrystalline silicone thin film 8, was formed under the deposition condition of being 13 nm/min and the upper portion corresponding to the remaining 80 nm in film thickness was formed under the deposition condition of being 24 nm/min. Therefore, productivity can be improved greatly when compared with the case where all the portions corresponding to 100 nm in film thickness of the microcrystalline silicon thin film 8 were formed under the deposition condition of being 13 nm/min.

Figure 3E:
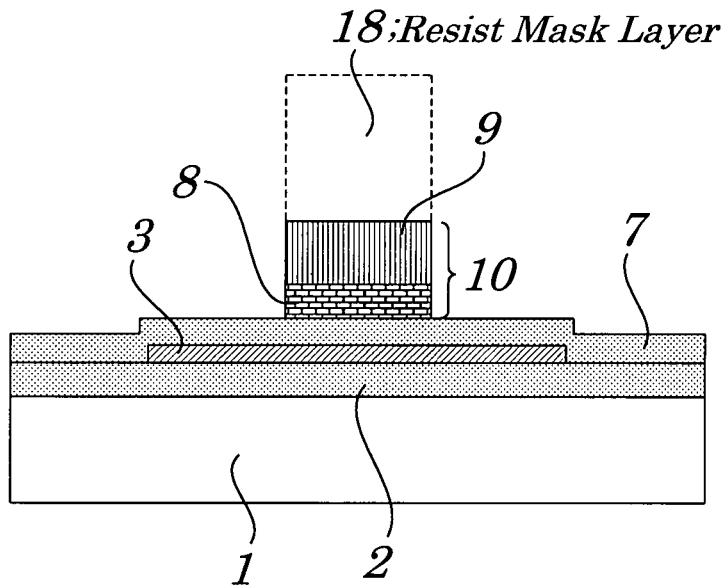

Next, a metal thin film 9 made of a chromium thin film with a thickness of 200 nm was formed on the microcrystalline silicon thin film 8 by a sputtering method. Then, as shown in FIG. 3E, by using a normal photo-resist method, patterning was performed on a resist coated on all the surfaces of the metal thin film 9 to form a resist mask 18 having a desired shape and, by using this resist mask 18, the metal thin film 9 and microcrystalline silicon thin film 8 were etched (or patterned) by a dry etching method using $Cl_2$ (chlorine) gas and $O_2$ gas as etching gas to form the gate electrode 10. The gate electrode 10 was constructed of a layer-stacked wiring. The layer-stacked wiring is made up of the microcrystalline silicon thin film (lower layer) 8 with a film thickness of 100 nm and the metal thin film 9 (upper layer) made of a chromium thin film with a film thickness of 200 nm.

Figure 3F:
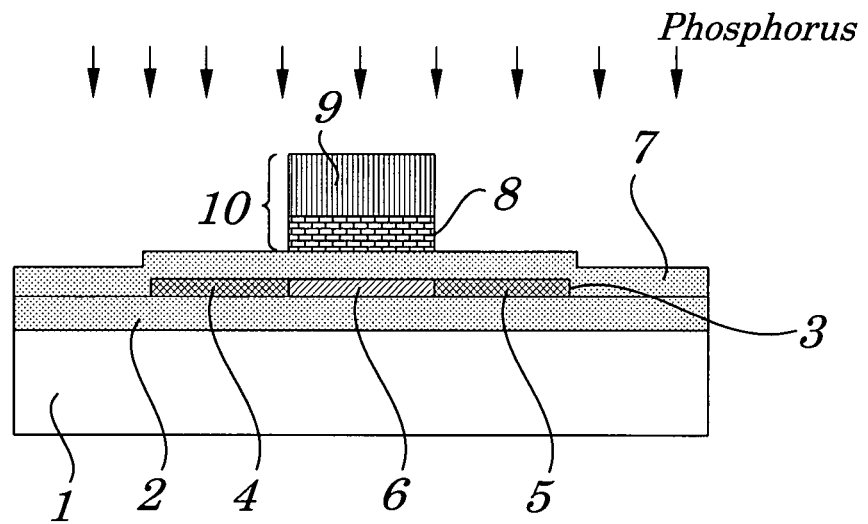

Then, after removal of the resist mask 18, as shown in FIG. 3F, phosphorus (P) was implanted into the polycrystalline thin film 3 through the gate insulating film 7 by an ion doping method using $PH_3$ gas (diluted with $H_2$ to 5% concentration) under doping conditions of an accelerated voltage being 50 keV, dose being $3 \times 10^{15}$ $cm^{-2}$, and pressure being 0.02 Pa, and the source region 4 and drain region 5 were formed by a self-alignment method using a pattern of the gate electrode 10 as a mask.

Figure 4G:
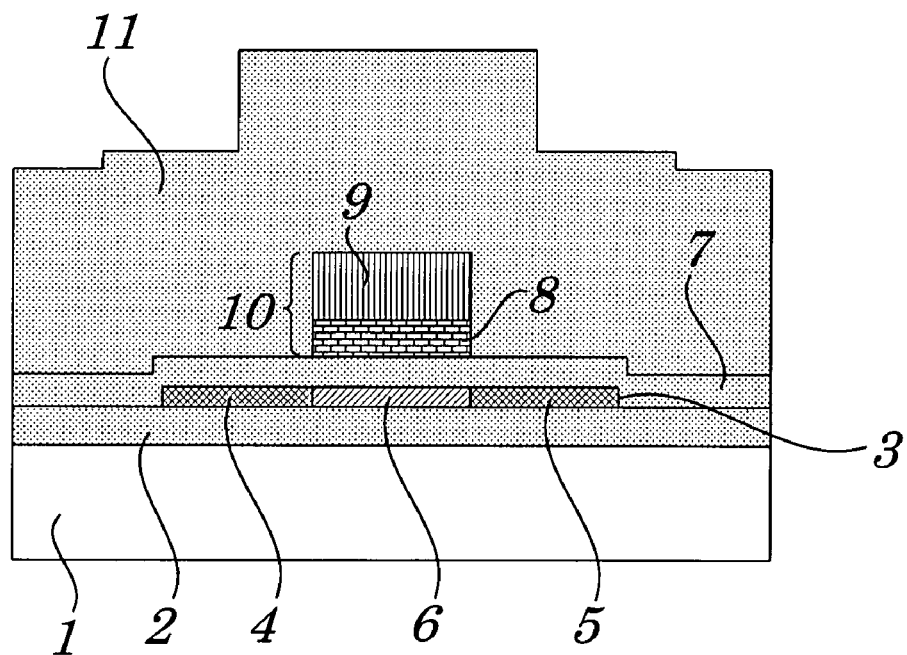
FIGS. 4G and 4H are also process diagrams illustrating, in order of processes, a manufacturing method of a semiconductor device according to the second embodiment of the present invention.

Next, as shown in FIG. 4G, a silicon dioxide thin film with a thickness of 400 nm was deposited, by a plasma CVD using TEOS gas and $O_2$ gas as material gas on all surfaces of the gate insulating film 7 and gate electrode 10 to form the interlayer insulating film 11. Then, to activate phosphorus implanted into the polycrystalline silicon thin film 3, heat treatment was performed at 450° C. for four hours in an atmosphere of nitrogen (activating process). The activating process was performed by a furnace annealing method using, for example, an annealing furnace. Then, to terminate a dangling bond in the polycrystalline silicon thin film 3 and at an interface between the polycrystalline thin film 3 and gate insulating film 7, heat treatment was performed at 400° C. for 30 minutes in hydrogen plasma (hydrogenating process).

During the activating and hydrogenating processes, the microcrystalline silicon thin film 8 reacts with the metal thin film 9 making up the upper layer to form silicide and the excessive silicide formation reaction causes peeling of the microcrystalline silicon thin film 8. To solve this, as described above, the lower portion of the microcrystalline silicon thin film 8 corresponding to 20 nm in film thickness was formed with the deposition condition of being 13 nm/min which is a deposition condition that can improve the film quality and the silicide formation reaction between the microcrystalline silicon thin film 8 and the metal thin film 9 can be suppressed, thus preventing peeling of the thin film.

Figure 4H:
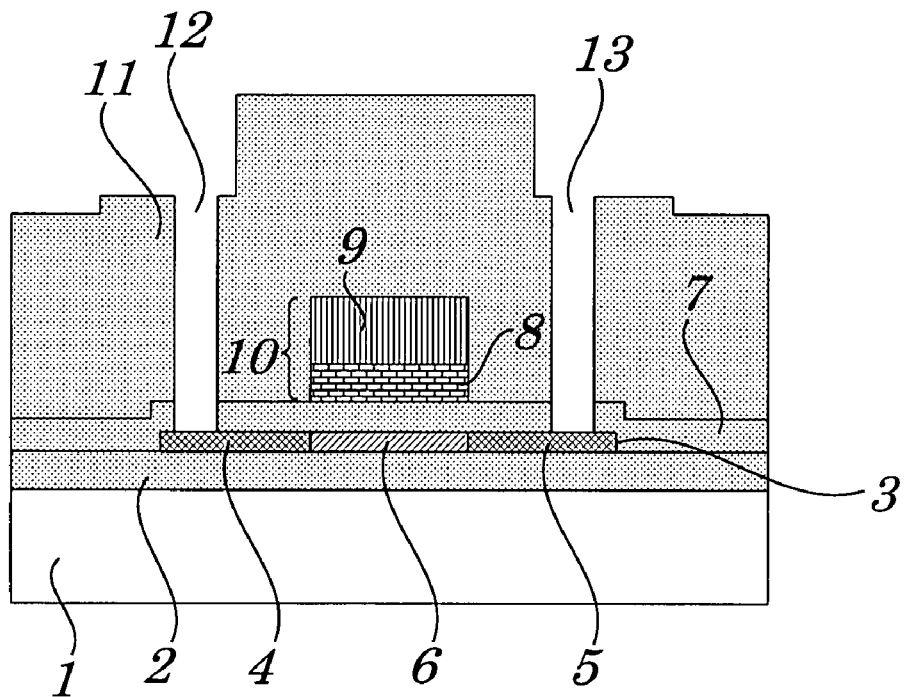

Next, as shown in FIG. 4H, patterning was performed on a resist coated by a normal photo-resist method on all surfaces of the interlayer insulating film 11 to form a resist mask (not shown) having a desired shape and, by using this resist mask, the interlayer insulating film 11 and gate insulating film 7 were selectively etched, by a dry etching method using $CF_4$ gas and $O_2$ gas as etching gas, to make the source region 4 and drain region 5 to form contact holes 12 and 13 respectively.

Then, after removal of the resist mask, an aluminum thin film with a thickness of 500 nm was deposited by a sputtering method on all surfaces thereof. Next, by using a resist mask (not shown) formed by a normal photo-resist method, the aluminum thin film was etched by a dry etching method using $Cl_2$ gas and $BCl_3$ (boron trichloride) gas as etching gas to form the source electrode 14 and drain electrode in a manner to be in contact with the source region 4 and drain region 5. Finally, by removing the resist mask, the polycrystalline silicon TFT 20 as shown in FIG. 1 was completed.

The resulting microcrystalline silicon thin film 8 formed in the second embodiment is so configured that its crystal grains each having a length of the microcrystalline silicon thin film in a direction of a film thickness being 60% or more of a film thickness of the microcrystalline silicon thin film amount to 6% of the total number of crystal grains or that its crystal grains each having a length of the microcrystalline silicon thin film in a direction of a film thickness being 50% or less of a film thickness of the microcrystalline silicon thin film amount to 94% of the total number of crystal grains.

Thus, in the method for manufacturing the polycrystalline silicon TFT of the second embodiment, according to the deposition conditions employed in the item No. 3 based on the principles of the invention shown in FIG. 10, the lower portion corresponding to 20 nm in film thickness of the microcrystalline silicon thin film 8 making up the gate electrode 10 is formed under the deposition condition of being 13 nm/min and the upper portion corresponding to remaining 20 nm in film thickness of the microcrystalline silicon thin film 8 is formed under the deposition condition of being 24 nm/min and, therefore, it is made possible to obtain crystal grains having structures described above, thereby suppressing an excessive silicide formation reaction between the micro-crystalline silicon thin film 8 and metal thin film 9 making up the upper layer and preventing peeling of the microcrystalline silicon thin film 8. This enables manufacturing of the polycrystalline silicon TFT having higher productivity and reliability when compared with conventional TFTs.

Third Embodiment

A method for manufacturing a polycrystalline silicon TFT (second manufacturing method) according to the third embodiment of the present invention is described. The manufacturing method of the polycrystalline silicon TFT of the third embodiment differs greatly from that employed in the above second embodiment in that a microcrystalline silicon thin film is formed under deposition conditions being different from those applied in the second embodiment. The process diagram for the second manufacturing method is approximately the same as for the first manufacturing method and their drawings are omitted accordingly.

In the second manufacturing method, according to the deposition conditions applied in the item No. 4 based on the principles of the invention shown in FIG. 10, a lower portion corresponding to 80 nm in film thickness out of 100 nm in film thickness of the microcrystalline silicon thin film 8 was formed under the deposition condition of being 24 nm/min and an upper portion corresponding to 20 nm in film thickness was formed under the deposition condition of being 13 nm/min. Here, the lower portion corresponding to 80 nm in film thickness of the microcrystalline silicon thin film 8 was formed by discharging for 201 seconds under deposition conditions of a flow rate of $SiH_4$ gas being 40 sccm, flow rate of $PH_3$ being 65 sccm, flow rate of $H_2$ gas being 2500 sccm, pressure being 260 Pa, discharge power density being 1.25 $W/cm^2$, and substrate temperature being 350° C. The upper portion corresponding to 20 nm in film thickness of the microcrystalline silicon thin film 8 was formed by discharging for 95 seconds under deposition conditions of a flow rate of $SiH_4$ gas being 20 sccm, flow rate of $PH_3$ being 65 sccm, flow rate of $H_2$ gas being 2500 sccm, pressure being 260 Pa, discharge power density being 1.25 $W/cm^2$, and substrate temperature being 350° C. Methods other than described above are the same as for the first manufacturing method and their descriptions are omitted accordingly.

The microcrystalline silicon thin film 8 formed in the third embodiment is so configured that its crystal grains each having a length of the microcrystalline silicon thin film in a direction of a film thickness being 60% or more of a film thickness of the microcrystalline silicon thin film amount to 13% of the total number of crystal grains or that its crystal grains each having a length of the microcrystalline silicon thin film in a direction of a film thickness being 50% or less of a film thickness of the micro-crystalline silicon thin film amount to 87% of the total number of crystal grains.

Thus, in the method for manufacturing the polycrystalline silicon TFT of the third embodiment, according to the deposition conditions employed in the item No. 4 based on the principles of the invention shown in FIG. 10, the lower portion corresponding to 80 nm in film thickness of the microcrystalline silicon thin film 8 making up the gate electrode 10 was formed under the deposition condition of being 24 nm/min and the upper portion corresponding to remaining 20 nm in film thickness of the microcrystalline silicon thin film 8 was formed under the deposition condition of being 13 nm/min. Therefore, it is made possible to obtain crystal grains having structures described above, thereby suppressing an excessive silicide formation reaction between the micro-crystalline silicon thin film 8 and metal thin film 9 making up the upper layer and preventing peeling of the microcrystalline silicon thin film 8. This enables manufacturing of the polycrystalline silicon TFT having higher productivity and reliability when compared with conventional TFTs.

Fourth Embodiment

A method for manufacturing a polycrystalline silicon TFT (third manufacturing method) according to the fourth embodiment of the present invention is described. The manufacturing method of the microcrystalline silicon TFT of the fourth embodiment differs greatly from that (first manufacturing method) employed in the above second embodiment in that a microcrystalline silicon thin film was formed under deposition conditions being different from those applied in the second embodiment. In the third manufacturing method, according to the deposition conditions applied in the item No. 5 based on the principles of the invention shown in FIG. 10, a microcrystalline silicon thin film corresponding to 100 nm in film thickness was formed under the deposition condition of being 24 nm/min. The microcrystalline silicon thin film corresponding to 100 nm in film thickness was formed by discharging for 201 seconds under deposition conditions of a flow rate of $SiH_4$ gas being 40 sccm, flow rate of $PH_3$ being 65 sccm, flow rate of $H_2$ gas being 2500 sccm, pressure being 260 Pa, discharge power density being 1.25 $W/cm^2$, and substrate temperature being 350° C. The upper portion corresponding to 20 nm in film thickness of the microcrystalline silicon thin film 8 was formed by discharging for 251 seconds under deposition conditions of a flow rate of $SiH_4$ gas being 20 sccm, flow rate of $PH_3$ being 65 sccm, flow rate of $H_2$ gas being 2500 sccm, pressure being 260 Pa, discharge power density being 1.25 $W/cm^2$, and substrate temperature being 350° C.

Next, in order to activate phosphorus implanted into the polycrystalline silicon thin film 3, heat treatment was performed at 450° C. for one hour in an atmosphere of nitrogen (activating process). Then, to terminate a dangling bond in the polycrystalline silicon thin film 3 and at an interface between the polycrystalline thin film 3 and gate insulating film 7, as in the case of the second manufacturing method, heat treatment was performed at 400° C. for 30 minutes in hydrogen plasma (hydrogenating process).

The microcrystalline silicon thin film 8 formed in the fourth embodiment is so configured that its crystal grains each having a length of the microcrystalline silicon thin film in a direction of a film thickness being 60% or more of a film thickness of the microcrystalline silicon thin film amount to 9% of the total number of crystal grains making up the microcrystalline silicon thin film 8 or that its crystal grains each having a length of the microcrystalline silicon thin film in a direction of a film thickness being 50% or less of a film thickness of the microcrystalline silicon thin film amount to 91% of the total number of crystal grains.

Thus, in the method for manufacturing the polycrystalline silicon TFT of the fourth embodiment, according to the deposition conditions employed in the item No. 5 based on the principles of the invention shown in FIG. 10, the microcrystalline silicon thin film 8 corresponding to 100 nm in film thickness was formed under the deposition condition of being 24 nm/min and, after the activation at 450° C. for one hour, the hydrogenating process was performed at 400° C. for 30 minutes. Therefore, it is made possible to obtain crystal grains having structures described above. As a result, an excessive silicide formation reaction between the microcrystalline silicon thin film 8 and metal thin film 9 making up the upper layer can be suppressed and peeling of the microcrystalline silicon thin film 8 can be prevented. This enables manufacturing of the polycrystalline silicon TFT having higher productivity and reliability when compared with conventional TFTs.

Fifth Embodiment

A method for manufacturing a polycrystalline silicon TFT (fourth manufacturing method) according to the fifth embodiment of the present invention is described. The manufacturing method of the microcrystalline silicon TFT of the fifth embodiment differs greatly from that (first manufacturing method) in the above second embodiment in that a microcrystalline silicon thin film is formed under deposition conditions being different from those employed in the second embodiment. In the fourth manufacturing method, according to the deposition conditions applied in the item No. 6 based on the principles of the invention shown in FIG. 10, a microcrystalline silicon thin film corresponding to 100 nm in film thickness was formed under the deposition condition of being 24 nm/min. Next, in order to activate phosphorus implanted into the polycrystalline silicon thin film 3, heat treatment was performed at 450° C. for 4 hours in an atmosphere of nitrogen (activating process). Then, to terminate a dangling bond in the polycrystalline silicon thin film 3 and at an interface between the polycrystalline thin film 3 and gate insulating film 7, heat treatment was performed at 400° C. for 5 minutes in hydrogen plasma (hydrogenating process).

The microcrystalline silicon thin film 8 formed in the fifth embodiment is so configured that its crystal grains each having a length of the microcrystalline silicon thin film in a direction of a film thickness being 60% or more of a film thickness of the microcrystalline silicon thin film amount to 9% of the total number of crystal grains or that its crystal grains each having a length of the microcrystalline silicon thin film in a direction of a film thickness being 50% or less of a film thickness of the microcrystalline silicon thin film amount to 91% of the total number of crystal grains.

Thus, in the method for manufacturing the polycrystalline silicon TFT of the fifth embodiment, according to the deposition conditions employed in the item No. 6 based on the principles of the invention shown in FIG. 10, the microcrystalline silicon thin film 8 corresponding to 100 nm in film thickness was formed under the deposition condition of being 24 nm/min and, after the activation at 450° C. for four hours, the hydrogenating process was performed at 400° C. for 5 minutes. Therefore, it is made possible to obtain crystal grains having structures described above. As a result, an excessive silicide formation reaction between the microcrystalline silicon thin film 8 and metal thin film 9 making up the upper layer can be suppressed and peeling of the microcrystalline silicon thin film 8 can be prevented. This enables manufacturing of the polycrystalline silicon TFT having higher productivity and reliability when compared with conventional TFTs.

Sixth Embodiment

A method for manufacturing a polycrystalline silicon TFT (fifth manufacturing method) according to the sixth embodiment of the present invention is described. The manufacturing method of the microcrystalline silicon TFT of the sixth embodiment differs greatly from that (first manufacturing method) employed in the above second embodiment in that a microcrystalline silicon thin film is formed under deposition conditions being different from those employed in the second embodiment. In the fifth manufacturing method, a microcrystalline silicon thin film corresponding to 100 nm in film thickness is formed under the deposition condition of being 24 nm/min. Next, in order to activate phosphorus implanted into the polycrystalline silicon thin film 3, heat treatment was performed at 450° C. for one hour in an atmosphere of nitrogen (activating process). Then, to terminate a dangling bond in the polycrystalline silicon thin film 3 and at an interface between the polycrystalline thin film 3 and gate insulating film 7, heat treatment was performed in hydrogen plasma (hydrogenating process).

The microcrystalline silicon thin film 8 formed in the sixth embodiment is so configured that its crystal grains each having a length of the microcrystalline silicon thin film in a direction of a film thickness being 60% or more of a film thickness of the microcrystalline silicon thin film amount to 13% of the total number of crystal grains, or that its crystal grains each having a length of the microcrystalline silicon thin film in a direction of a film thickness being 50% or less of a film thickness of the micro-crystalline silicon thin film amount to 87% of the total number of crystal grains.

Thus, in the method for manufacturing the polycrystalline silicon TFT of the sixth embodiment, according to the deposition conditions employed in the item No. 6 based on the principles of the invention shown in FIG. 10, the microcrystalline silicon thin film 8 corresponding to 100 nm in film thickness was formed under the deposition condition of being 24 nm/min and, after the activation at 450° C. for one hour, the hydrogenating process was performed. Therefore, it is made possible to obtain crystal grains having structures described above. As a result, an excessive silicide formation reaction between the microcrystalline silicon thin film 8 and metal thin film 9 making up the upper layer can be suppressed and, as a result, peeling of the microcrystalline silicon thin film 8 can be prevented. This enables manufacturing of the polycrystalline silicon TFT having higher productivity and reliability when compared with conventional TFTs.

In the first to fifth method of manufacturing the polycrystalline silicon TFT 20 (in the second embodiment to sixth embodiment), it can be generally summarized that the microcrystalline silicon thin film 8 formed in the above embodiments is so configured that its crystal grains each having a length of the microcrystalline silicon thin film in a direction of a film thickness being 60% or more of a film thickness of the microcrystalline silicon thin film amount to 6% to 9% of the total number of crystal grains making up the microcrystalline silicon thin film 8, or that its crystal grains each having a length of the microcrystalline silicon thin film in a direction of a film thickness being 50% or less of a film thickness of the microcrystalline silicon thin film amount to 87% to 91% of the total number of crystal grains making up the microcrystalline silicon thin film.

It is apparent that the present invention is not limited to the above embodiments but may be changed and modified without departing from the scope and spirit of the invention. For example, in the above embodiments, an example is described in which the layer-stacked wiring made up of the microcrystalline silicon thin film is used as the gate electrode of the polycrystalline TFT, however, the layer-stacked wiring may be used not only for the gate electrode or TFT but also for interconnection of various electronic components. In the embodiment, the activating process was performed at 400° C., however, the same effect can be obtained even if the activating process may be performed at 400° C. or more. In the above embodiments, the hydrogenating process was performed at 400° C., however, the same effect can be obtained even if the activating process may be performed at 350° C. or more. In the above embodiments, an example is provided in which the front-end insulating film, gate insulating film, and interlayer insulating film, or the like are formed by the plasma CVD method, however, these films may be formed also by a low-pressure CVD using $SiH_4$ gas or $N_2O$ gas as material gas. In the above embodiments, a silicon dioxide silicon thin film is used as the front-end insulating film, gate insulating film, interlayer insulating film, or the like, however, not only the silicon dioxide silicon thin film but also other insulating films such as a silicon nitride thin film, a silicon nitride oxide thin film, or a like may be used. An example is provided in which the amorphous silicon thin film is formed by the plasma CVD, however, the amorphous silicon thin film may be formed by a low-pressure CVD using $Si_2H_6$ (disilane) gas as material gas. In the above embodiments, a chromium thin film is used as the metal thin film making up the upper layer of the gate electrode, however, instead of chromium, aluminum, molybdenum, tungsten, niobium or alloy of these metals may be employed. In the above embodiments, the furnace annealing method using an annealing furnace is used in the activating process, however, instead of the furnace annealing method, a laser annealing method using laser light, RTA (Rapid Thermal Anneal) method in which high-temperature nitrogen gas is sprayed, or a like may be used. In the above embodiments, in the hydrogenating process, heat treatment was performed in hydrogen plasma, however, the heat treatment may be performed in an atmosphere of hydrogen. Furthermore, the interlayer insulating film may be formed during the hydrogenating process or after the completion of the hydrogenating process.

What is claimed is:

1. A semiconductor device comprising:
    a polycrystalline silicon thin film having a source region and a drain region at its both ends, which is formed on an insulating substrate with a frontend insulating film interposed between said polycrystalline silicon thin film and said insulating substrate; and
    a gate electrode formed on said polycrystalline silicon thin film with a gate insulating film interposed between said gate electrode and said polycrystalline silicon thin film, wherein said gate electrode comprises a layer-stacked wiring comprising:
    a microcrystalline silicon thin film; and
    a metal thin film formed on said microcrystalline silicon thin film,
    wherein crystal grains making up a crystal structure of said microcrystalline silicon thin film, each having a length of said microcrystalline silicon thin film in a direction of a film thickness being 60% or more of a film thickness of said microcrystalline silicon thin film amount to 15% or less of total number of said crystal grains.

2. A semiconductor device comprising:
    a polycrystalline silicon thin film having a source region and a drain region at its both ends, which is formed on an insulating substrate with a frontend insulating film interposed between said polycrystalline silicon thin film and said insulating substrate; and
    a gate electrode formed on said polycrystalline silicon thin film with a gate insulating film interposed between said gate electrode and said polycrystalline silicon thin film, wherein said gate electrode comprises a layer-stacked wiring comprising:
    a microcrystalline silicon thin film; and
    a metal thin film formed on said microcrystalline silicon thin film,
    wherein crystal grains making up a crystal structure of said microcrystalline silicon thin film, each having a length of said microcrystalline silicon thin film in a direction of a film thickness being 50% or less of a film thickness of said microcrystalline silicon thin film amount to 85% or more of the total number of crystal grains.

3. A method for manufacturing a semiconductor device comprising:
    a process of forming an amorphous silicon thin film on an insulating substrate with a frontend insulating film interposed between said amorphous silicon thin film and said insulating substrate;
    a process of crystallizing said amorphous silicon thin film to form a polycrystalline silicon thin film by performing a laser annealing process on said amorphous silicon thin film;
    a process of forming, after making said polycrystalline silicon thin film have an island structure, a layer-stacked film comprising a microcrystalline silicon thin film and a metal thin film which are stacked sequentially on a gate insulating film; and
    a process of performing patterning on said layer-stacked film to form a gate electrode having a desired shape;
    wherein, as said microcrystalline silicon thin film, a thin film is used whose crystal grains, each having a length of said microcrystalline silicon thin film in a direction of a film thickness being 60% or more of a film thickness of said thin film amount to 15% or less of total number of crystal grains making up said thin film or whose crystal grains, each having a length of said thin film in a direction of a film thickness being 50% or less of a film thickness of said thin film amount to 85% or more of the total number of crystal grains making up said thin film.

* * * * *